United States Patent
Yamamoto (10) Patent No.: US 7,595,538 B2
(45) Date of Patent: Sep. 29, 2009

(54) SEMICONDUCTOR DEVICE

(75) Inventor: Ichiro Yamamoto, Kawasaki (JP)

(73) Assignee: Nec Electronics Corporation, Kanagawa (JP)

( * ) Notice: Subject to any disclaimer, the term of this patent is extended or adjusted under 35 U.S.C. 154(b) by 511 days.

(21) Appl. No.: 11/205,141

(22) Filed: Aug. 17, 2005

(65) Prior Publication Data

US 2006/0038236 A1 Feb. 23, 2006

(30) Foreign Application Priority Data

Aug. 17, 2004 (JP) .............................. 2004-237587

(51) Int. Cl.
*H01L 29/72* (2006.01)
(52) U.S. Cl. .................. 257/410; 257/295; 257/368; 257/406; 257/411
(58) Field of Classification Search ................ 257/295, 257/368, 406, 410, 411
See application file for complete search history.

(56) References Cited

U.S. PATENT DOCUMENTS

| 2002/0130340 A1* | 9/2002 | Ma et al. ..................... 257/295 |
| 2004/0065957 A1* | 4/2004 | Maekawa et al. ........... 257/758 |
| 2005/0269651 A1* | 12/2005 | Chen et al. ................... 257/411 |
| 2006/0131670 A1* | 6/2006 | Ogura et al. ................ 257/406 |

FOREIGN PATENT DOCUMENTS

| JP | 2002-314072 | 10/2002 |
| WO | WO 01/35500 | 5/2001 |

OTHER PUBLICATIONS

Masahiro Koike et al., Effect of Hf-N Bond on Properties of . . . , Mar. 2003.
E. Cartier et al., Systematic Study of pFET $V_t$ With Hf-Based Gate . . . , Jun. 15-17, 2004; pp. 44, 45.
C. Hobbs et al., Fermi Level Pinning at the Polysi/Metal Oxide Interface; Jun. 9, 2004; pp. 62, 63.
G.D. Wilk et al, High-k Gate Dielectrics: Current Status and Materials Properties Considerations, May 15, 2001; vol. 89, No. 10, pp. 5244-5275.

* cited by examiner

*Primary Examiner*—Edward Wojciechowicz
(74) *Attorney, Agent, or Firm*—Young & Thompson (57) ABSTRACT

A P-type MOSFET 120 includes a semiconductor substrate (N-well 102*b*); a gate insulating film formed on the semiconductor substrate, composed of a high-dielectric-constant film 108 which contains a silicate compound containing a first element selected from the group consisting of Hf, Zr and any of lanthanoids, together with N; a gate electrode formed on the gate insulating film, and is configured by a polysilicon film 114 containing a P-type impurity; and a blocking oxide film 110 formed between the gate insulating film and the gate electrode, blocking a reaction between the first element and the polysilicon film 114, and having a relative dielectric constant of 8 or above.

11 Claims, 6 Drawing Sheets

GATE ELECTRODE

GATE INSULATING FILM    SEMICONDUCTOR SUBSTRATE

FIG. 4B

INTERFACIAL TRAP CHARGE

DEPLETION LAYER CHARGE

GATE ELECTRODE

GATE INSULATING FILM    SEMICONDUCTOR SUBSTRATE

SEMICONDUCTOR DEVICE

This application is based on Japanese patent application No. 2004-237587 the content of which is incorporated hereinto by reference.

DISCLOSURE OF THE INVENTION

1. Field of the Invention

The present invention relates to a semiconductor device comprising a gate insulating film composed of a high-dielectric-constant film, and a gate electrode composed of a polysilicon film containing a P-type impurity.

2. Related Art

Recently, discussion on using high-dielectric-constant film, called high-k film, as a component for composing semiconductor devices has started. Use of the high-dielectric-constant film as a gate insulating film of MOSFET can reduce electrical thickness in terms of equivalent silicon oxide thickness of the gate insulating film, even if the physical thickness thereof is increased to a certain extent, and can realize the gate insulating film stable both in the physical sense and structural sense. This makes it possible to increase MOS capacity for the purpose of improving MOSFET characteristics, and to reduce gate leakage current as compared with conventional cases using a silicon oxide film.

Japanese Laid-Open Patent Publication No. 2002-314072 describes a semiconductor device having, at least in a part thereof, a structure in which an electrode made of Si or SiGe is formed on Si, while placing a dielectric film in between, wherein the dielectric film is composed of a first amorphous oxide film, a crystalline oxide film, and a second amorphous oxide film, as viewed from the Si side. The description teaches that the crystalline oxide film is formed using any one of, or a stack of two or more films of $ZrO_2$, $HfO_2$, $TiO_2$, $Ta_2O_5$, BST, STO and PZT. It is also described that the first amorphous oxide film is composed of a metal oxide containing $SiO_2$ or $Al_2O_3$, and the second amorphous oxide film is composed of a metal oxide containing $Al_2O_3$.

Japanese Laid-Open Patent Publication 2002-314072 raised a problem in that, when the gate electrode was composed of Si or SiGe, direct formation of Si or SiGe on the crystalline oxide film such as being composed of $ZrO_2$, for example, undesirably resulted in partial reduction of $ZrO_2$ because a reductive atmosphere during the film formation thereof adversely affected grain boundary of $ZrO_2$, and this resulted in increase in the leakage current. Japanese Laid-Open Patent Publication No. 2002-314072 solved this problem by forming an amorphous metal oxide film such as $Al_2O_3$ and the like on $ZrO_2$, to thereby prevent $ZrO_2$ from being exposed directly to the reductive atmosphere during formation of the Si or SiGe electrode.

It has been reported that addition of nitrogen, for example, to Hf silicate or Zr silicate can amorphize high-dielectric-constant films composed of these materials (for example in Masahiro Koike et al., "Effect on Hf—N Bond on Properties of Thermally Stable Amorphous HfSiON and Applicability of this Material to Sub-50 nm Technology Node LSIs", 2003 IEEE, 0-7803-7873-3/03). Use of an amorphous film as the high-dielectric-constant film ensure absence of the above-described grain boundary, and this makes it possible, even if Si or SiGe is formed thereon, to prevent the material composing the high-dielectric-constant film from being reduced by the reductive atmosphere during the film growth. Use of this sort of materials as the high-dielectric-constant film makes it no more necessary to further form thereon the amorphous metal oxide film as described in the above, because the high-dielectric-constant film per se is amorphous.

A structure in which $Al_2O_3$ cap is formed on Hf-silicate is disclosed (E. Cartier et al., "Systematic study of pFET Vt with Hf-based gate stacks with poly-Si and FUSI gates", 2004 Symposium on VLSI Technology Digest o Technical Papers, pp 44-45, 2004).

It has, however, been becoming clear recently that use of a high-dielectric-constant material such as a HfSiON film as the gate insulating film raises another problem of causing an extremely high threshold voltage Vth of P-type MOSFET and a lowered ON current, as compared with a case where $SiO_2$ is used for the gate insulating film. Recent investigations have also given findings on a phenomenon called Fermi level pinning, which occurs when the gate insulating film is configured using a high-dielectric-constant film and the gate electrode is configured using polysilicon (C. Hobbs et al., "Fermi Level Pinning at the PolySi/Metal Oxide Interface", 2003 Symposium on VLSI Technology Digest of Technical Papers, 4-89114-035-6/03). Fermi level pinning is supposed to occur, in the vicinity of an interface on the gate insulating film side in the gate electrode, when a metal composing the high-dielectric-constant film diffuses into polysilicon composing the gate electrode, and new levels ascribable to bonding between silicon and the metal are produced.

When a metal composing the high-dielectric-constant film diffuses into polysilicon composing the gate electrode of an MOSFET (metal oxide semiconductor field effect transistor), a depletion layer generates in polysilicon in the vicinity of the interface with the gate insulating film. Under influence of such depletion layer, application of gate voltage fails in applying a sufficient level of electric field to the gate insulating film, and makes it difficult to induce carriers in the channel region. This raised a problem of increase in the threshold voltage and increase in variation of the threshold voltage.

The Fermi level pinning is more likely to occur when Zr or Hf is used for the high-dielectric-constant film, and polysilicon containing a P-type impurity is used for the gate electrode.

SUMMARY OF THE INVENTION

In the process of investigating into countermeasures against the above-described problems, the present inventors had an idea of forming a film, capable of blocking diffusion of a metal composing the high-dielectric-constant film into polysilicon, between the high-dielectric-constant film and the gate electrode composed of a polysilicon film would be successful in suppressing generation of the depletion layer in polysilicon, and studied various materials suitable for composing the blocking film.

The present inventors finally found that, as the blocking film, use of an oxide film having a certain level of blocking function and a large relative dielectric constant was successful in blocking diffusion of a metal composing the high-dielectric-constant film into polysilicon, without degrading an effect of reducing EOT (equivalent oxide thickness), and reached to propose the present invention below.

According to the present invention, there is provided a semiconductor device comprising: a semiconductor substrate; a gate insulating film formed on the semiconductor substrate, composed of a high-dielectric-constant film which contains a silicate compound containing a first element selected from the group consisting of Hf, Zr and any of lanthanoids, together with N; a gate electrode formed on the gate insulating film, and is configured by a polysilicon film containing a P-type impurity; and a blocking oxide film formed between the gate insulating film and the gate electrode, blocking a reaction between the first element and the polysilicon film, and having a relative dielectric constant of 8 or above.

The semiconductor device herein can be configured as a P-type MOSFET. The semiconductor device can be configured also as a CMOS (complementary metal oxide semiconductor) comprising a P-type MOSFET and an N-type MOSFET. The lanthanoids may include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), Lu (lutetium).

The high-dielectric-constant film in the semiconductor device of the present invention may be amorphous. As described in the above, addition of nitrogen to Hf silicate, Zr silicate or the like, can amorphize the high-dielectric-constant film composed of any of these materials. This makes it possible to improve the heat resistance of the high-dielectric-constant film, and also to suppress the leakage current.

The above-described literature (C. Hobbs et al., "Fermi Level Pinning at the PolySi/Metal Oxide Interface", 2003 Symposium on VLSI Technology Digest of Technical Papers, 4-89114-035-6/03) reported that provision of a high-dielectric-constant film such as a $HfO_2$ film in contact with polysilicon is causative of producing Fermi level pinning. In particular, P-type MOSFET can largely be affected by Fermi level pinning, causing a larger increase in the threshold voltage.

In contrast to this, the present invention, characterized by having the blocking oxide film formed between the high-dielectric-constant film and the polysilicon film, can successfully reduce the amount of metal composing the high-dielectric-constant film possibly diffuses into polysilicon, and therefore can suppress generation of the depletion layer in polysilicon. This makes Fermi level pinning less likely to occur, and makes it possible to suppress increase in the threshold voltage of the semiconductor device, and to reduce variation in the threshold voltage.

Because an oxide film having a relative dielectric constant of 8 or above is used as the blocking oxide film, an effect of reducing EOT through the use of the high-dielectric-constant film as the insulating film will not be impaired, and the relative dielectric constant will not be degraded through oxidation of the blocking oxide film.

In the semiconductor device of the present invention, the blocking oxide film may contain an oxide of a second element selected from the group consisting of Al and Y.

Such second element does not adversely affect the polysilicon film through reaction therewith even if brought into contact therewith, and can preferably be used as a material composing the blocking oxide film. The blocking oxide film may typically be composed of $Al_2O_3$ (relative dielectric constant approximately 8 to 10), $Y_2O_3$ (relative dielectric constant approximately 15), or nitrides of these materials. These materials are amorphous, and therefore can further improve the effect of suppressing the leakage current, when the high-dielectric-constant film is configured using the above-described amorphous materials.

By using the amorphous high-dielectric-constant film together with the amorphous blocking oxide film, the phenomenon that the metal composing the high-dielectric-constant film diffuses into the blocking oxide film, which especially occurs when the high-dielectric-constant film includes crystallized portion, can be suppressed such that the ability for blocking the metal diffusion can be preferably improved.

In the semiconductor device of the present invention, the blocking oxide film can be configured using a material having a negative fixed charge.

According to the present invention, there is also provided a semiconductor device comprising: a semiconductor substrate; a gate insulating film formed on the semiconductor substrate, composed of a high-dielectric-constant film which contains a silicate compound containing a first element selected from the group consisting of Hf, Zr and any of lanthanoids, together with N; a gate electrode formed on the gate insulating film, and is configured by a polysilicon film containing a P-type impurity; and a blocking oxide film formed between the gate insulating film and the gate electrode, configured by using a material having a negative fixed charge, and having a relative dielectric constant of 8 or above.

Figure 4A:
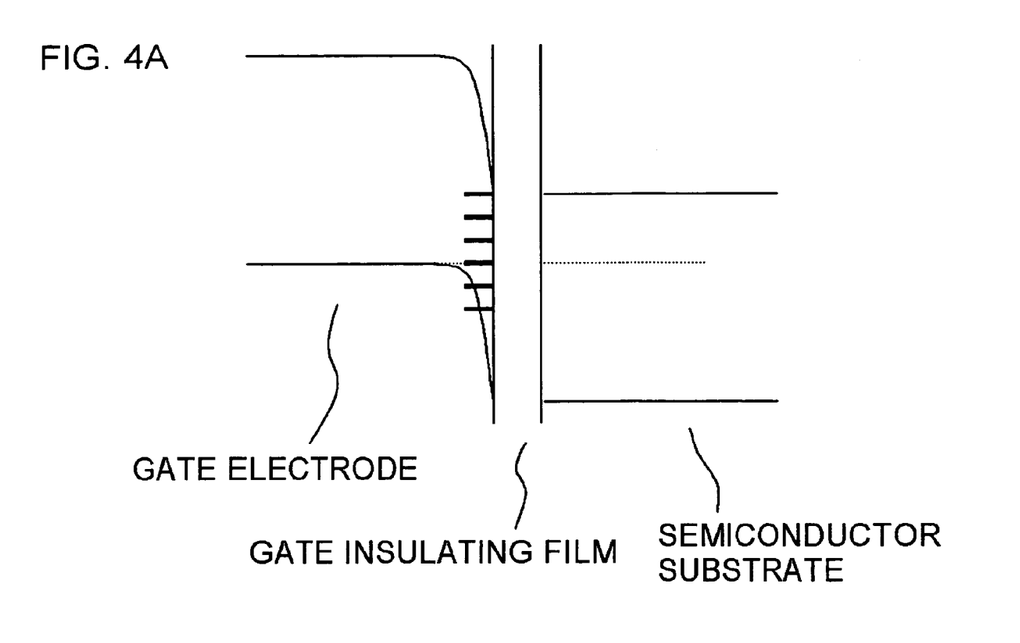
FIGS. 4A and 4B are schematic drawings showing states of an interface between a high-dielectric-constant film using HfSiON and a polysilicon film formed in contact therewith and containing a P-type impurity.
Figure 4B:
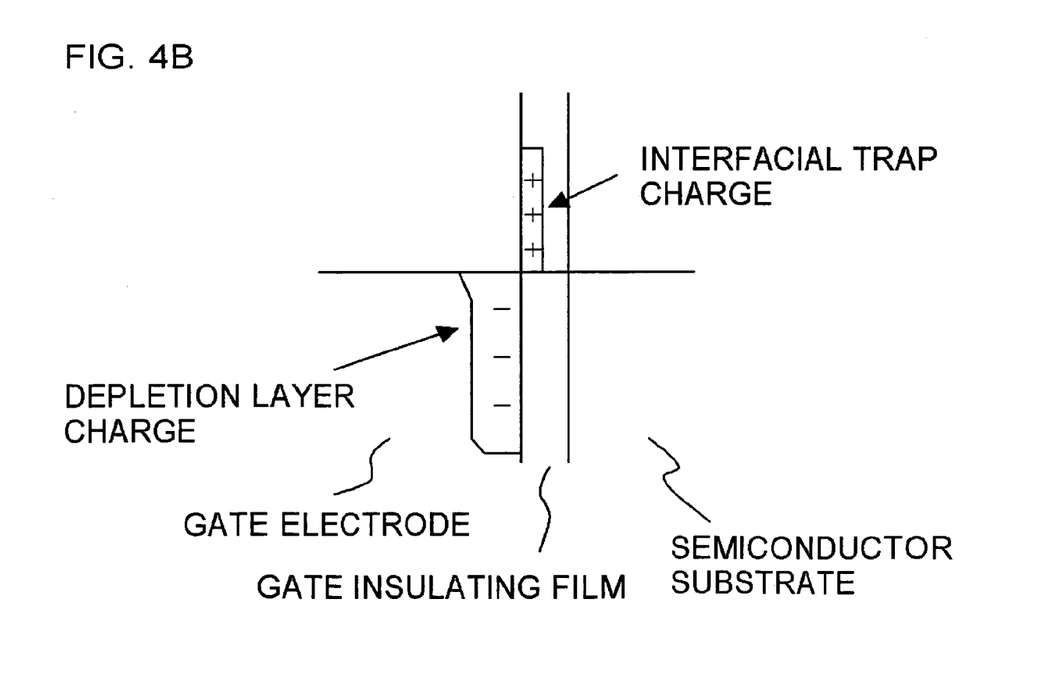

FIGS. 4A and 4B are schematic drawings showing states of an interface between a high-dielectric-constant film using HfSiON and a polysilicon film formed in contact therewith and containing a P-type impurity. FIG. 4B is an enlarged view of FIG. 4A. In this case, Hf in the gate insulating film configured by the high-dielectric-constant film reacts with Si in the gate electrode configured by the polysilicon film, to thereby form a Hf—Si bond, wherein the bond is causative of generating the interfacial trap. A hole in the polysilicon film containing a P-type impurity is caught by the interfacial trap, produces positive interfacial trap charge, and this consequently shifts Vfb (flat band voltage) and Vth (threshold voltage) towards the negative direction.

As described in the above, provision of the blocking oxide film between the high-dielectric-constant film and the polysilicon film makes it possible to block reaction of the first element with the polysilicon film, and thereby to reduce the amount of interfacial charge. This is successful in suppressing generation of the depletion layer, and occurrence of Fermi level pinning. By configuring the high-dielectric-constant film using a material having a negative fixed charge, positive interfacial trapped charge can be canceled. This makes it possible to suppress increase in the threshold voltage of the semiconductor device, and to reduce variation in the threshold voltage.

The above-described $Al_2O_3$ is known to have a negative fixed charge (see for example, G. D. Wilk et al., "High-k gate dielectrics: Current status and materials properties considerations", Journal of Applied Physics Volume 89, Number 10, pp. 5243-5275, 2001, and Published Japanese Translation of PCT International Publication for Patent Application No. 2003-514382), so that influence of Fermi level pinning can more effectively be reduced by configuring the blocking oxide film using $Al_2O_3$.

In the semiconductor device of the present invention, ratio of the first element in the gate insulating film to the second element in the blocking oxide film may be adjusted to 0.15 or above, or more preferably 0.5 or above (molar ratio). This makes it possible to ensure a desirable barrier performance of the blocking oxide film.

In the semiconductor device of the present invention, ratio of the first element in the gate insulating film to the second element in the blocking oxide film may be adjusted to 2 or below (molar ratio). This makes it possible to ensure an effect of decreasing EOT through use of the high-dielectric-constant film as the gate insulating film. It is also made possible to suppress increase in the threshold voltage of a P-type MOSFET, even when an N-type MOSFET having a gate electrode composed of a polysilicon film containing a P-type impurity is formed at the same time with a P-type MOSFET having a gate electrode composed of a polysilicon film containing a P-type impurity, without impairing characteristics of the N-type MOSFET.

In the semiconductor device of the present invention, the high-dielectric-constant film may be configured using HfSiON. The high-dielectric-constant film shows a large influence of the above-described Fermi level pinning, when it contains Hf. In contrast, the present invention having the blocking oxide film formed between the high-dielectric-constant film and the polysilicon film makes it possible to reduce influence of Fermi level pinning, even when Hf is used as a material composing the high-dielectric-constant film. It is also possible to configure the high-dielectric-constant film using ZrSiON or lanthanoid nitrate silicate.

The semiconductor device of the present invention may further comprise a silicon oxide film provided between the semiconductor substrate and the gate insulating film. The silicon oxide film may also contain nitrogen.

Provision of the silicon oxide film between the semiconductor substrate and the high-dielectric-constant film makes it possible to prevent diffusion of a metal in the high-dielectric-constant film from diffusing into the semiconductor substrate.

The semiconductor device of the present invention can further comprise a second gate insulating film formed on the semiconductor substrate, composed of a high-dielectric-constant film which contains a silicate compound containing a first element selected from the group consisting of Hf, Zr and any of lanthanoids, together with N; and a second gate electrode formed in contact with the high-dielectric-constant film composing the second gate insulating film, and is configured by using a polysilicon film containing an N-type impurity.

The semiconductor device of the present invention may be configured as a CMOS device comprising an N-type MOSFET and a P-type MOSFET. The N-type MOSFET may be formed at the different place from the place where the P-type MOSFET is formed, on the semiconductor substrate. The P-type MOSFET herein can be configured as providing the blocking oxide film between the high-dielectric-constant film and the polysilicon film, and the N-type MOSFET can be configured as disposing the polysilicon film directly on the high-dielectric-constant film, without providing the blocking oxide film. This makes it possible to suppress increase in the threshold voltage of the P-type MOSFET, while keeping desirable characteristics of the N-type MOSFET.

The present invention is therefore successful in suppressing increase in the threshold voltage of a semiconductor device which comprises a gate insulating film composed of a high-dielectric-constant film, and a gate electrode composed of a polysilicon film containing a P-type impurity.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention referring to the attached drawings. Any constituents commonly appear in the drawings will have the same reference numerals, allowing omission of repetitive explanations on occasions.

Figure 1:
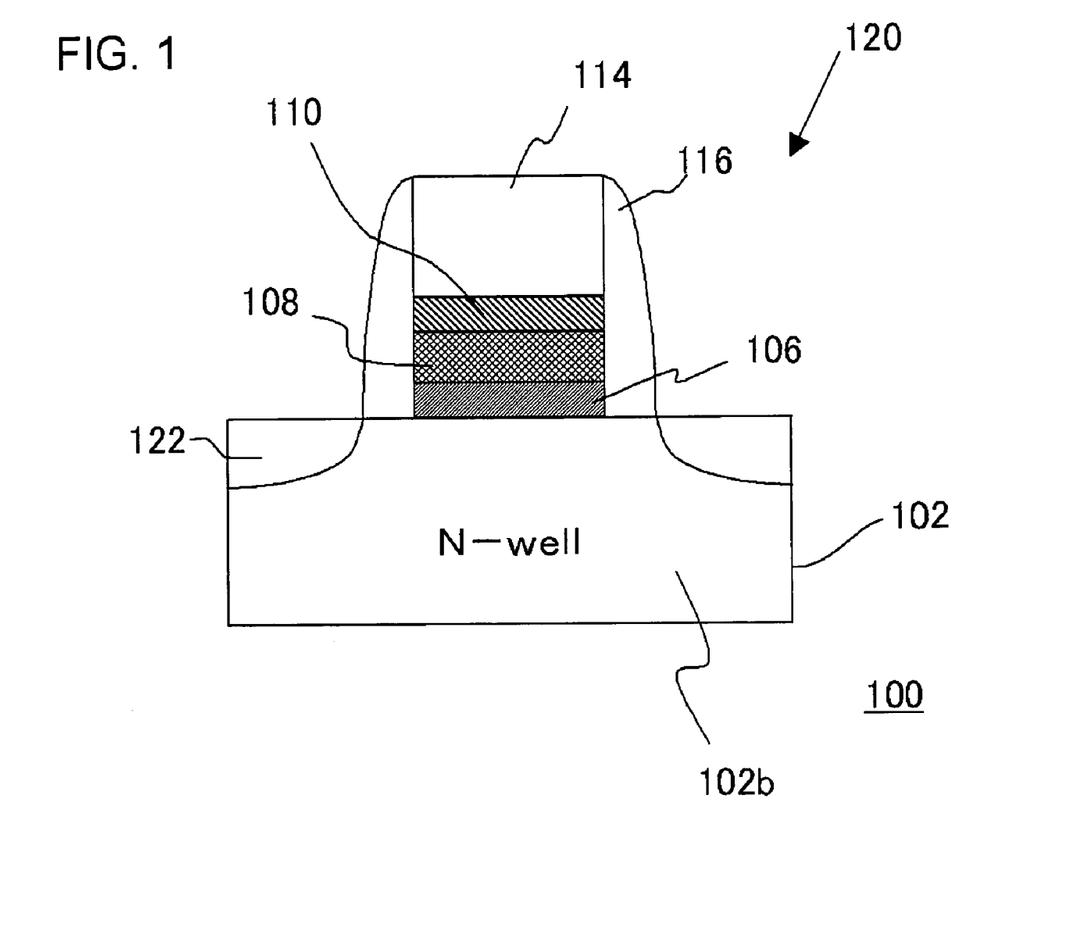
FIG. 1 is a sectional view showing an exemplary configuration of a semiconductor device of one embodiment.

FIG. 1 is a sectional view showing an exemplary configuration of a semiconductor device 100 of this embodiment. In this embodiment, the semiconductor device 100 contains a P-type MOSFET 120.

The semiconductor device 100 has silicon substrate 102 having an N-well 102b with N-type conductivity formed therein, a pair of impurity-diffused regions 122 formed in the N-well 102b, a channel region (not shown) formed therebetween, a silicon oxide film 106 formed on the channel region, a high-dielectric-constant film 108 formed on the silicon oxide film 106, a blocking oxide film 110 formed on the high-dielectric-constant film 108, a polysilicon film 114 formed on the blocking oxide film 110, and sidewall insulating films 116. The silicon oxide film 106 and the high-dielectric-constant film 108 compose a gate insulating film, and the polysilicon film 114 composes a gate electrode. The polysilicon film 114 has a P-type impurity such as B (boron) doped therein. A P-type MOSFET 120 is thus configured by the above-described constituents.

The high-dielectric-constant film 108 has a relative dielectric constant larger than that of silicon oxide, and can be configured using so-called, high-k film. The high-dielectric-constant film 108 can be composed of a material having a relative dielectric constant of 10 or larger. More specifically, the high-dielectric-constant film 108 may be a silicate film containing an element selected from the group consisting of Hf, Zr and any of lanthanoids, together with N. Use of this sort of materials makes it possible to raise the relative dielectric constant of the high-dielectric-constant film 108 and to ensure the film with a desirable heat resistance. This successfully contributes to downsizing of the MOSFET, and improvement in the reliability.

The ratio of nitrogen content in the high-dielectric-constant film 108 to the total content of all elements composing the high-dielectric-constant film 108 may be adjusted to 5% (atomic percentage) or more. This successfully amorphizes the high-dielectric-constant film 108, and suppresses the leakage current. The ratio of nitrogen content in the high-dielectric-constant film 108 to the total content of all elements composing the high-dielectric-constant film 108 may also be adjusted to 20% (atomic percentage) or less. This is successful in keeping a desirable interfacial characteristics.

The blocking oxide film 110 has a function of blocking diffusion of a metal element contained in the high-dielectric-constant film 108 into the polysilicon film 114. The blocking oxide film 110 can be configured as an oxide film composed of a material having a relative dielectric constant of 8 or above. More specifically, the blocking oxide film 110 can contain an oxide or oxinitride of an element selected from the group consisting of Al and Y. The blocking oxide film 110 can be configured typically as an $Al_2O_3$ film or an $Y_2O_3$ film. The film composed of any of these materials has a large relative dielectric constant, and will not be lowered in the relative dielectric constant through changes in the film quality due to oxidation, because the film has already been oxidized. It is therefore made possible to block diffusion of a metal element contained in the high-dielectric-constant film 108 into the polysilicon film 114, without degrading an effect of reducing EOT through use of the above described high-dielectric-constant film 108 as the gate insulating film. These materials having an amorphous nature can also enhance an effect of suppressing the leakage current, when an amorphous material is used for composing the high-dielectric-constant film 108. In addition, the blocking oxide film 110 may be configured using a film including nitrogen. When the film including nitrogen is used as the blocking oxide film 110, the ability of the blocking oxide film 110 for blocking the diffusion of the metal included in the high-dielectric-constant film 108 can be further improved. In this case, the ratio of nitrogen content in the blocking oxide film 110 to the total content of all elements composing the blocking oxide film 110 may be adjusted to 5% (atomic percentage) or more.

Thickness of the blocking oxide film 110 can be adjusted to 0.2 nm or above, for example. This ensures a function of blocking diffusion of a metal element contained in the high-dielectric-constant film 108 into the polysilicon film 114. Thickness of the blocking oxide film 110 can be adjusted to 1 nm or below. This is successful in blocking diffusion of a metal composing the high-dielectric-constant film 108 into the polysilicon film 114, without degrading an effect of reducing EOT through use of the above-described high-dielectric-constant film 108 as the gate insulating film. It is to be understood that "thickness" simply denoted herein means thickness in the direction of stacking.

The blocking oxide film 110 can be configured using a material having a negative fixed charge. As described in the above referring to FIGS. 4A and 4B, a metal element contained in the high-dielectric-constant film 108 diffuses into the polysilicon film 114 can form a bond with Si in the polysilicon film 114 when it diffuses thereinto. The bond is causative of generating an interfacial trap which captures a hole in the polysilicon film containing a P-type impurity, to thereby produce a positive interfacial charge. The blocking oxide film 110 having a negative fixed charge can therefore cancel the positive interfacial charge with the negative fixed charge of its own, and can thereby more effectively suppress increase in the threshold voltage of the P-type MOSFET 120.

$Al_2O_3$ is known to have a negative fixed charge, so that use of $Al_2O_3$ as a material for composing the blocking oxide film 110 is successful in blocking diffusion of a metal element contained in the above-described high-dielectric-constant film 108 into the polysilicon film 114, and in canceling positive interfacial charge, to thereby effectively suppress increase in the threshold voltage of the P-type MOSFET 120.

A problem of increase in the threshold voltage of the P-type MOSFET 120 might arise when the high-dielectric-constant film 108 is configured using a material containing the above-described element as being affected by Fermi level pinning, but the configuration of the semiconductor device 100 of this embodiment, in which the blocking oxide film 110 is disposed between the high-dielectric-constant film 108 and the polysilicon film 114 of the P-type MOSFET 120, can reduce the effect of Fermi level pinning.

FIG. 2A to FIG. 3G are sectional views showing process steps of fabricating the semiconductor device having the configuration shown in FIG. 1. The description herein will be made on procedures of fabricating a CMOS device in which the N-type MOSFET 118 is formed at the same time with the P-type MOSFET 120.

Figure 2A:
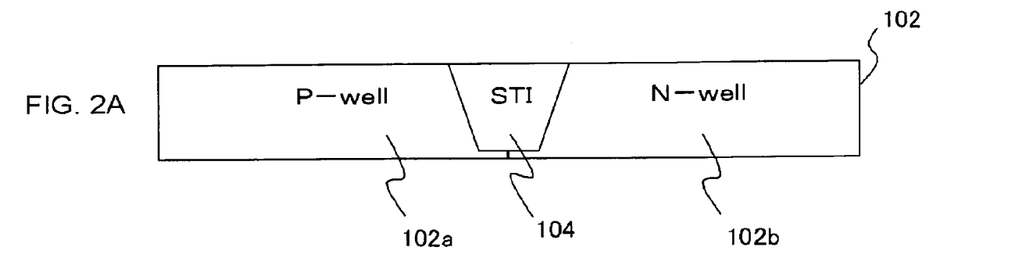
FIGS. 2A to 2D are sectional views showing process steps of fabricating the semiconductor device of the embodiment.

First, a device isolation region (STI) 104 is formed on the silicon substrate 102 by a publicly-known STI (Shallow Trench Isolation) process, and P-type and N-type impurities are ion-implanted to form the P-well 102a and the N-well 102b, respectively (FIG. 2A). The device isolation region 104 may be formed by any other publicly-known methods such as the LOCOS process. The device isolation region 104 isolates the P-well 102a and the N-well 102b.

Next, a channel region is formed in each of the P-well 102a and the N-well 102b by a publicly-known method. It is also possible herein to form a punch-through stopper region under each of the channel regions of the P-well 102a and the N-well 102b by ion-implanting an impurity. Formation of such punch-through stopper region is successful in suppressing the short-channel effect.

Figure 2B:
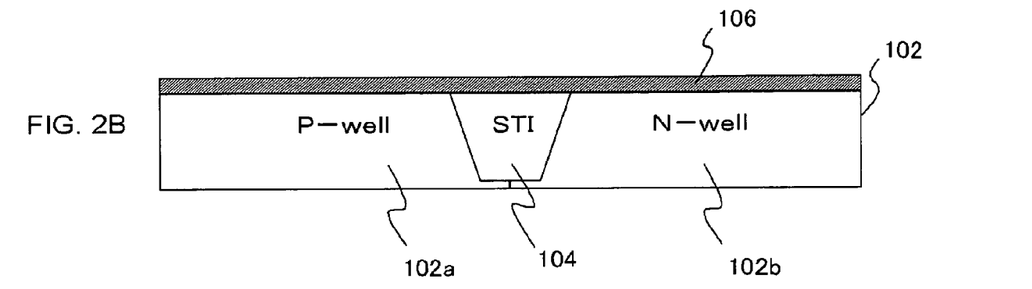

Next, the silicon oxide film 106 (approximately 1 nm to 2 nm thick, for example) is formed on the surface of the silicon substrate 102 (FIG. 2B). The silicon oxide film 106 can be formed typically by thermally oxidizing the surface of the silicon substrate 102. Conditions for the thermal oxidation may typically include a process temperature of 900° C. (centigrade) and a process time of 40 to 50 seconds or around.

Figure 2C:
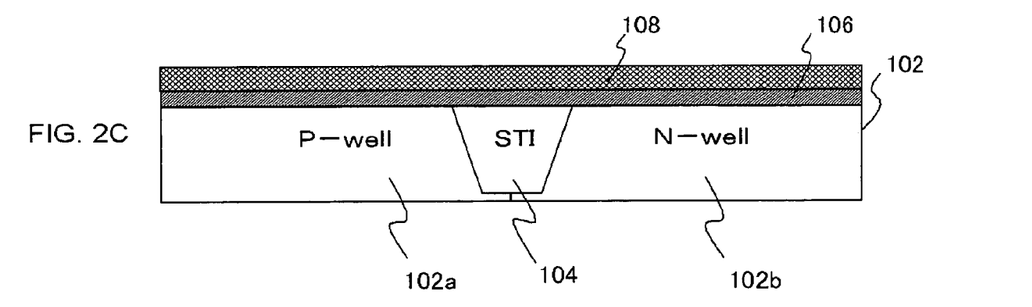

Next, on the silicon oxide film 106, the high-dielectric-constant film 108 (approximately 2 nm thick, for example) is formed (FIG. 2C). The high-dielectric-constant film 108 can be formed typically by the CVD process, the ALD (atomic layer deposition) process and the sputtering process. This embodiment adopts HfSiON as a material composing the high-dielectric-constant film 108. Formation of the film is carried out first by using an organic hafnium source gas, an oxidative gas and a silicon-containing gas. For example, oxygen can be used as the oxidative gas, and monosilane ($SiH_4$) can be used as the silicon-containing gas. Hafnium silicate (HfSiO) is thus formed.

Annealing is thereafter carried out typically using a nitrogen-containing gas such as ammonia. Annealing conditions typically include a process temperature of 900 to 1000° C. (centigrade), and a process time of 40 seconds. By the annealing, nitrogen is introduced into hafnium silicate to thereby amorphize the high-dielectric-constant film 108. Introduction of nitrogen can be carried out also by nitrogen plasma treatment. It is still also possible to introduce nitrogen during forming the high-dielectric-constant film 108 such as by sputtering or the like to thereby produce HfSiON. Further, the HfSiN film may be formed by sputtering, and then the film is oxidized to form the HfSiON film.

Figure 2D:
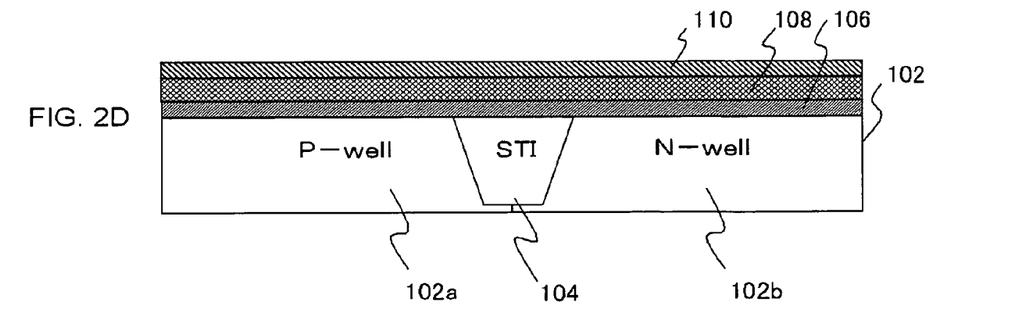

Next, the blocking oxide film 110 (typically of approximately 0.7 nm thick) is formed on the high-dielectric-constant film 108 (FIG. 2D). The blocking oxide film 110 can be formed by any of the CVD process, ALD process and sputtering process. This embodiment adopts $Al_2O_3$ as a material composing the blocking oxide film 110, and formation of the film is proceeded by the ALD process using source gases which comprise $Al(CH_3)_3$ and an oxidative gas such as $O_3$ or $H_2O$.

The blocking oxide film 110 can be configured so as to adjust ratio of Al or Y contained in the blocking oxide film 110 to Hf, Zr and any of lanthanoids contained in the high-dielectric-constant film 108 to 0.15 or above, more preferably 0.5 or above (molar ratio). This is successful in ensure a desirable barrier performance. The blocking oxide film 110 can also be configured so as to adjust ratio of Al or Y contained therein to Hf, Zr and any of lanthanoids contained in the high-dielectricconstant film 108 to 2 or below (molar ratio). This is successful in ensuring a desirable barrier performance. This also makes it possible to keep desirable characteristics of the N-type MOSFET 118.

When $Al_2O_3$ is adopted as the blocking oxide film 110, the $Al_2O_3$ may be nitrided. With the use of the nitrided $Al_2O_3$, it is possible to further improve reliability of the semiconductor device 100 with suppressing increase in EOT and the threshold voltage.

Figure 3E:
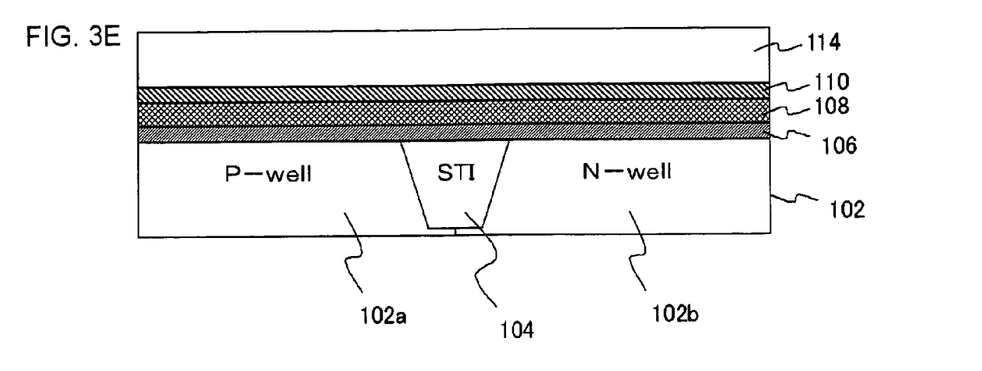
FIGS. 3E to 3G are sectional views showing process steps of fabricating the semiconductor device of the embodiment.

Next, on the blocking oxide film 110, the polysilicon film 114 is formed (FIG. 3E). Next, an N-type impurity is ion-implanted into the polysilicon film 114 formed on the P-well 102a, and a P-type impurity is ion-implanted in the polysilicon film 114 formed on the N-well 102b.

Figure 3F:
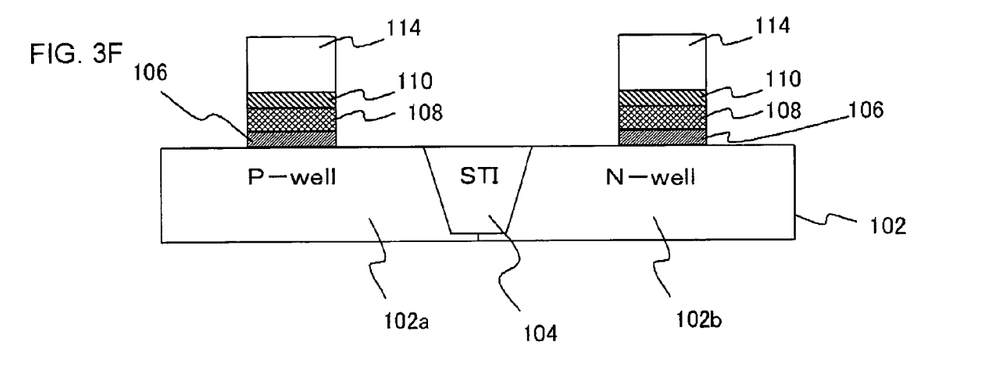
Figure 3G:
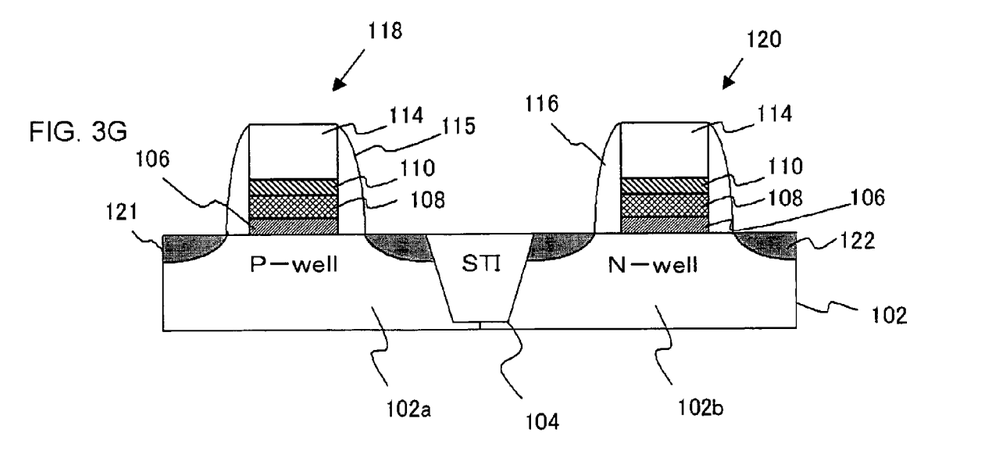

Next, the silicon oxide film 106, the high-dielectric-constant film 108, the blocking oxide film 110, and the polysilicon film 114 are selectively dry-etched so as to obtain a form of the gate electrode (FIG. 3F). Next, on the P-well 102a, sidewall insulating films 115 are formed on the side faces of the silicon oxide film 106, the high-dielectric-constant film 108, the blocking oxide film 110, and of the polysilicon film 114. On the N-well 102b, sidewall insulating films 116 are formed on the side faces of the silicon oxide film 106, high-dielectric-constant film 108, blocking oxide film 110, and of the polysilicon film 114 (FIG. 3G). The sidewall insulating film 115 and the sidewall insulating film 116 can be formed by anisotropic etching typically using a fluorocarbon gas.

Next, source/drain extension regions which serve as electrically connection portions between the channel region and impurity-diffused regions described later are formed respectively in the surficial portions of the P-well 102a and the N-well 102b.

Next, the impurity-diffused regions 121 are formed by doping an N-type impurity such as P or As into the surficial portion of the P-well 102a, through a mask composed of the gate electrode and the sidewall insulating film 115. Further, the impurity-diffused regions 122 are formed by doping a P-type impurity such as B or Al into the surficial portion of the N-well 102b through a mask composed of the gate electrode and the sidewall insulating film 116. Source regions and drain regions are thus formed. The impurities are then activated by annealing, for example about 1000° C. (centigrade), in a non-oxidative atmosphere. Through these processes, the semiconductor device, configured as a CMOS device composed of the N-type MOSFET 118 and the P-type MOSFET 120 are formed.

As described in this embodiment, by nitriding the high-dielectric-constant film 108, the high-dielectric-constant film 108 can be kept amorphous, without forming crystallized portion, even after the high temperature process in which impurities are activated by annealing. By forming the blocking oxide film 110 on the high-dielectric-constant film 108 which is kept amorphous, the ability for blocking the diffusion of the metal included in the high-dielectric-constant film 108 can be more improved compared with the case when the high-dielectric-constant film is crystallized. Especially, by using the amorphous high-dielectric-constant film together with the amorphous blocking oxide film, the blocking ability for the metal can be further improved.

As described in the above, the semiconductor device 100 of this embodiment has the blocking oxide film 110 provided between the high-dielectric-constant film 108 and the polysilicon film 114 of the P-type MOSFET 120, and can suppress influences by Fermi level pinning. This makes it possible to suppress increase in the threshold voltage of the P-type MOSFET 120, and to reduce variations in the threshold voltage.

EXAMPLES

Example 1

Using the P-type MOSFET 120 configured as shown in FIG. 1, investigations were made on whether (i) a $SiO_2$ film, (ii) a SiN film and (iii) a $Al_2O_3$ film, as the blocking film disposed between the high-dielectric-constant film 108 and the polysilicon film 114, have a function of blocking diffusion of a metal composing the high-dielectric-constant film into polysilicon (referred to as "blocking function", hereinafter), or not.

Results are shown below:
(i) $SiO_2$ film: Because this film needs a considerable increase in the thickness in order to satisfy an effective level of the blocking function, and has a low relative dielectric constant, it was found to impair the effect of reducing EOT (equivalent $SiO_2$ thickness) attained through use of the high-dielectric-constant film as the gate insulating film;
(ii) SiN film: Found to have a certain level of blocking function. The SiN film has a relative dielectric constant larger than the $SiO_2$ film has, but is oxidized when brought into contact with the high-dielectric-constant film by oxygen contained therein, to be changed into a $SiO_2$ film. It was found that the relative dielectric constant dropped during the operation, and thereby the effect of reducing EOT (equivalent $SiO_2$ thickness) obtained through use of the high-dielectric-constant film as the gate insulating film was impaired.
(iii) $Al_2O_3$ film: The film had a large relative dielectric constant and was found to have a larger blocking function than the $SiO_2$ film had. The film was therefore found to never impair the effect of reducing EOT (equivalent $SiO_2$ thickness) attained through use of the high-dielectric-constant film as the gate insulating film, even under a thickness allowing an effective level of blocking function.

Example 2

The P-type MOSFET 120 configured as shown in FIG. 1, without the sidewall insulating film 116, were fabricated.

The silicon oxide film 106, the thickness of which was about 1.0 to 2.0 nm, was formed on the silicon substrate 102. Then, the HfSiO film, the thickness of which was about 1.0 to 2.5 nm, was formed thereon by the CVD process. Subsequently, the nitrogen plasma treatment was thereafter carried out on the HfSiO film to form the HfSiON film (high-dielectric-constant film 108). Then, the $Al_2O_3$ film (blocking oxide film 110) was formed on the high-dielectric-constant film 108. The polysilicon film 114 was formed on the blocking oxide film 110, and the polysilicon film 114 was patterned to form the gate electrode. Then, ion-implant was performed to form the source and drain (impurity-diffused regions 122). Subsequently, activation was performed by annealing at about 1000° C. to form the transistor structure. Here, three transistor structures each having the $Al_2O_3$ film whose thickness was 2 angstrom, 4 angstrom, and 8 angstrom.

Reference Example 1

Ref. 1

The silicon oxide film was formed on the silicon substrate. Then, the polysilicon film was formed on the silicon oxide film, and the polysilicon film was patterned to form the gate electrode. Then, ion-implant was performed to form the source and drain. Subsequently, activation was performed by annealing at about 1000° C. to form the transistor structure.

Reference Example 2

Ref. 2

The silicon oxide film was formed on the silicon substrate. Then, the HfSiO film is formed thereon by the CVD process. Subsequently, the nitrogen plasma treatment was thereafter carried out on the HfSiO film to form the HfSiON film. Then, the polysilicon film was formed on the HfSiON film, and the polysilicon film was patterned to form the gate electrode. Then, ion-implant was performed to form the source and drain. Subsequently, activation was performed by annealing at about 1000° C. to form the transistor structure (without the $Al_2O_3$ film)

Reference Example 3

The silicon oxide film was formed on the silicon substrate. Then, the HfSiO film is formed thereon by the CVD process. Subsequently, the $Al_2O_3$ film was formed on the HfSiO film without the nitrogen plasma treatment. Then, the polysilicon film was formed on the HfSiO film, and the polysilicon film was patterned to form the gate electrode. Then, ion-implant was performed to form the source and drain. Subsequently, activation was performed by annealing at about 1000° C. to form the transistor structure.

Figure 5:
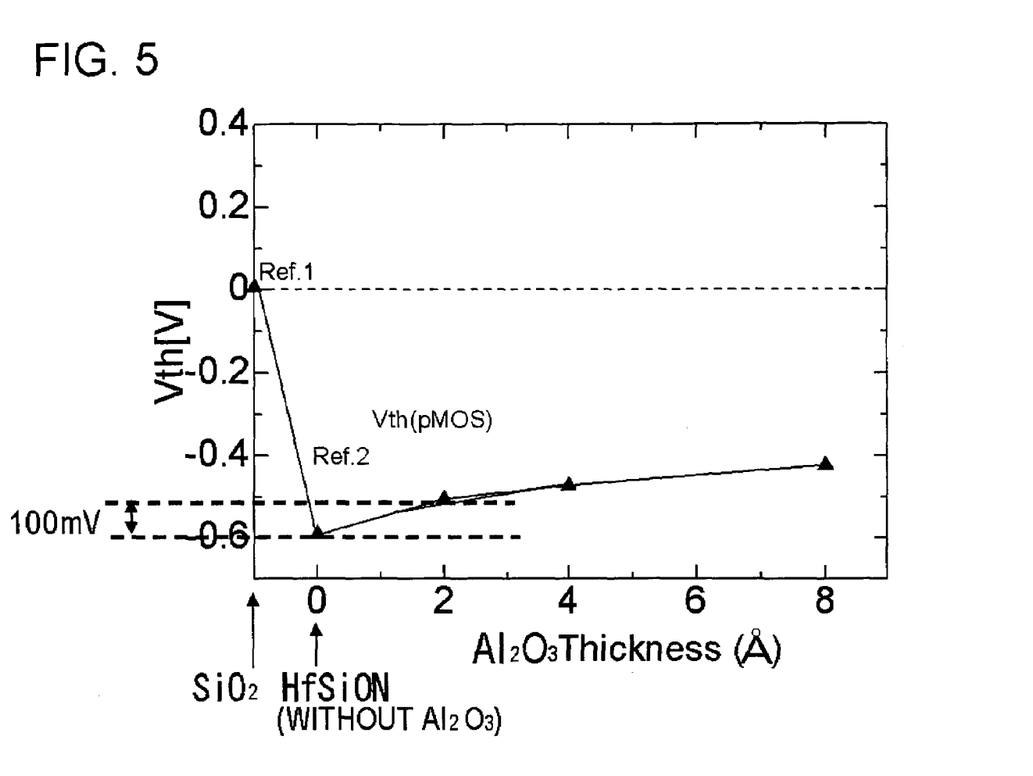
FIG. 5 shows the relationship between the threshold voltage Vth and the thickness of the $Al_2O_3$ film.

FIG. 5 shows the relationship between the threshold voltage Vth and the thickness of the $Al_2O_3$ film.

The threshold voltage Vth of the transistor structure of the example 2 to which the $Al_2O_3$ film is introduced, increased compared with that of the transistor structure of the reference example 2 without the $Al_2O_3$ film. As for the transistor structure of the example 2 in which the thickness of the $Al_2O_3$ film is 2 angstrom, the threshold voltage Vth increased 100 mV, which is a minimum necessary amount for improving the transistor characteristics, compared with that of the reference example 2. As the increase of the thickness of the $Al_2O_3$ film, the threshold voltage increased.

Figure 6:
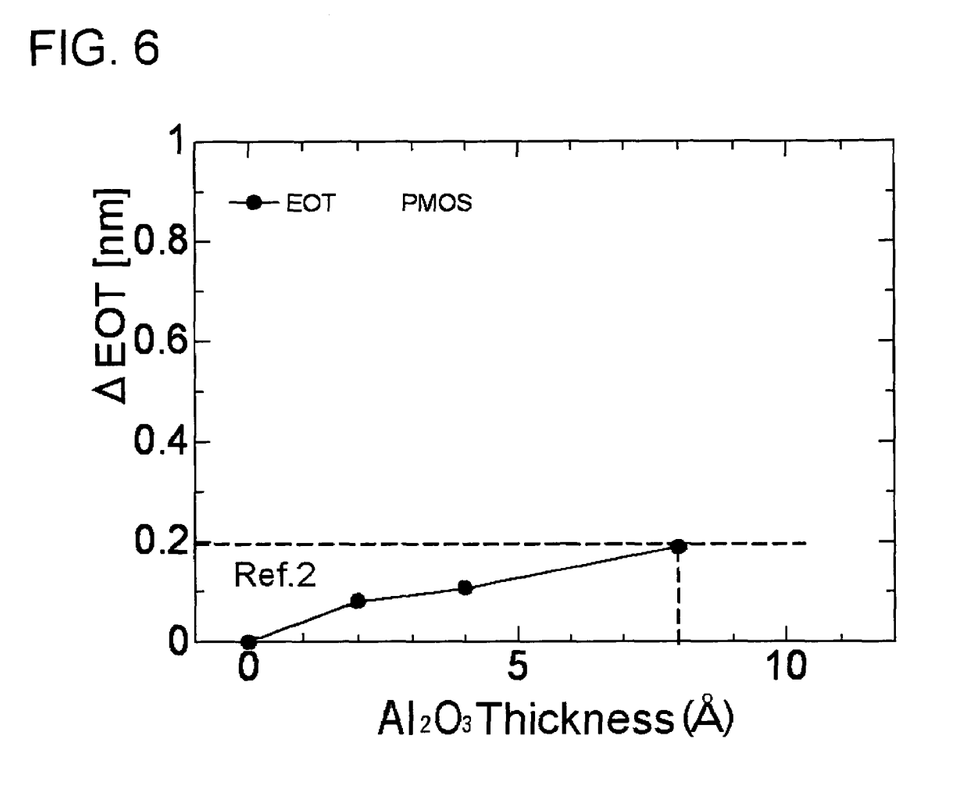
FIG. 6 shows the relationship between EOT and the thickness of the $Al_2O_3$ film.

FIG. 6 shows the relationship between EOT and the thickness of the $Al_2O_3$ film.

The EOT increased as the thickness of the $Al_2O_3$ film increased. When the thickness of the $Al_2O_3$ film is 8 angstrom, the EOT of the transistor structure increased by 2 angstrom (0.2 nm) compared with that of the transistor structure without the $Al_2O_3$ film. It means that as for the transistor structure including the $Al_2O_3$ film whose thickness is more than 8 angstrom, the effect of using the high-dielectric-constant film is cancelled. Therefore, it has been shown that the transistor structure having its characteristic improved with reducing EOT is provided, by introducing the $Al_2O_3$ film as the blocking oxide film whose thickness is between equal to or above 2 angstrom and equal to or below 8 therewith.

In addition, as for the semiconductor structure of the reference example 3, where the high-dielectric-constant film is configured using the HfSiO film, it has been proved that the long term reliability (life time) was less than ten years. It can be considered that the HfSiO film includes the crystallized portion which may cause a leakage path of the leakage current.

On the other hand, as for the semiconductor structure of the example 2, where the high-dielectric-constant film is configured using the HfSiON film, it has been proved that the long term reliability (life time) was not less than ten years. As for the HfSiON film of the example 2, the HfSiON film was proved to be amorphous even after the activation process. This may be the reason for the high reliability.

The foregoing paragraphs have described embodiments and examples of the present invention referring to the attached drawings, merely for explanatory purposes, while allowing adoption of other various configurations.

The N-type MOSFET 118 described in the above was configured as including the blocking oxide film 110, whereas the N-type MOSFET 118 can be configured also as having no blocking oxide film 110. With this configuration, in the P-type MOSFET 120, provision of the blocking oxide film 110 makes it possible to prevent increase in the threshold voltage, and at the same time to keep desirable characteristics of the N-type MOSFET 118.

What is claimed is:

1. A semiconductor device comprising:
   a semiconductor substrate;
   a gate insulating film formed on said semiconductor substrate, composed of a high-dielectric-constant film which contains a silicate compound containing a first element selected from the group consisting of Hf, Zr and any of lanthanoids, together with N;
   a gate electrode formed on said gate insulating film, and is configured by a polysilicon film containing a P-type impurity; and
   a blocking oxide film formed between said gate insulating film and said gate electrode, configured by using a material having a negative fixed charge, said blocking oxide film being in contact with said high-dielectric-constant film of said gate insulating film and said polysilicon film of said gate electrode.

2. The semiconductor device according to claim 1, wherein said blocking oxide film is configured by using $Al_2O_3$.

3. The semiconductor device according to claim 2, wherein said blocking oxide film is configured by using nitrided $Al_2O_3$.

4. The semiconductor device according to claim 1, wherein a ratio of said second element in said blocking oxide film to said first element in said gate insulating film is 0.15 or above (molar ratio).

5. The semiconductor device according to claim 1, wherein said high-dielectric-constant film is amorphous.

6. The semiconductor device according to claim 1, wherein a ratio of nitrogen content in said high-dielectric-constant film to a total content of all elements composing said high-dielectric-constant film is adjusted to 5% (atomic percentage) or more.

7. The semiconductor device according to claim 1, wherein said high-dielectric-constant film is configured by using HfSiON.

8. The semiconductor device according to claim 1, further comprising a silicon oxide film provided between said semiconductor substrate and said gate insulating film.

9. The semiconductor device according to claim 1, further comprising:
   a second gate insulating film formed on said semiconductor substrate, composed of a high-dielectric-constant film which contains a silicate compound containing a first element selected from the group consisting of Hf, Zr and any of lanthanoids, together with N; and
   a second gate electrode formed in contact with said high-dielectric-constant film composing said second gate insulating film, and is configured by using a polysilicon film containing an N-type impurity.

10. The semiconductor device according to claim 1, wherein the blocking oxide film has a relative dielectric constant of 8 or above.

11. A semiconductor device comprising:

a semiconductor substrate;

a gate insulating film formed on said semiconductor substrate, composed of a high-dielectric-constant film which contains a silicate compound containing a first element selected from the group consisting of Hf, Zr and any of lanthanoids, together with N;

a gate electrode formed on said gate insulating film, and is configured by a polysilicon film containing a Ptype impurity; and a blocking oxide film formed between said gate insulating film and said gate electrode, blocking a reaction between said first element and said polysilicon film, and having a relative dielectric constant of 8 or above, said blocking oxide film being in contact with said high-dielectric-constant film of said gate insulating film and said polysilicon film of said gate electrode, said blocking film being composed of at least one of an oxide or oxynitride of at least one of Al or Y.

* * * * *

UNITED STATES PATENT AND TRADEMARK OFFICE
CERTIFICATE OF CORRECTION

PATENT NO.        : 7,595,538 B2
APPLICATION NO.   : 11/205141
DATED             : September 29, 2009
INVENTOR(S)       : Ichiro Yamamoto It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 919 days.

Signed and Sealed this

Twenty-eighth Day of September, 2010

David J. Kappos
*Director of the United States Patent and Trademark Office*